US009800355B1

(12) United States Patent
Lee et al.

(10) Patent No.: US 9,800,355 B1
(45) Date of Patent: Oct. 24, 2017

(54) SYSTEM AND METHOD FOR PERFORMING OVER-THE-AIR (OTA) TESTING OF A DEVICE UNDER TEST (DUT) HAVING AN INTEGRATED TRANSMITTER-ANTENNA ASSEMBLY USING NEAR FIELD AND INTERMEDIATE FIELD MEASUREMENTS

(71) Applicant: Keysight Technologies, Inc., Minneapolis, MN (US)

(72) Inventors: Gregory S. Lee, Mountain View, CA (US); Christopher Coleman, Santa Clara, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/382,718

(22) Filed: Dec. 18, 2016

(51) Int. Cl.
*H04B 17/00* (2015.01)
*H04B 17/17* (2015.01)
*G01R 29/10* (2006.01)
*H04B 17/29* (2015.01)
*H04B 5/00* (2006.01)

(52) U.S. Cl.
CPC ............. *H04B 17/17* (2015.01); *G01R 29/10* (2013.01); *H04B 5/0043* (2013.01); *H04B 17/29* (2015.01)

(58) Field of Classification Search
USPC ... 455/67.14, 67.11, 67.12, 67.13, 41.1–41.3
See application file for complete search history.

(56) References Cited

U.S. PATENT DOCUMENTS

| | | | | |
|---|---|---|---|---|
| 8,212,718 B2* | 7/2012 | Utagawa | ................... | G01S 7/03 331/107 R |
| 8,295,777 B1* | 10/2012 | Yenney | ................ | H04W 24/06 455/435.1 |
| 8,467,756 B2* | 6/2013 | Ozaki | .................... | G01R 29/10 455/115.1 |
| 8,502,546 B2 | 8/2013 | Nyshadham et al. | | |
| 8,941,401 B2* | 1/2015 | Pagani | ............... | G01R 31/2884 324/754.21 |

(Continued)

FOREIGN PATENT DOCUMENTS

| | | |
|---|---|---|
| CN | 104764938 A | 7/2015 |
| WO | 2016059140 A1 | 4/2016 |

OTHER PUBLICATIONS

Ozaktas et al., "Fractional Fourier optics," Journal of the Optical Society of America, vol. 12, No. 4, pp. 743-751 (1995).

(Continued)

*Primary Examiner* — Fayyaz Alam

(57) ABSTRACT

A test system for testing a DUT includes near field and intermediate field measurement devices located in a near field and an intermediate field, respectively, of the DUT antenna that sample first and second bounded radiation surfaces, respectively, comprising RF signals emitted by the DUT antenna in at least first and second directions in which the bounded radiation surfaces extend. A receiver of the test system generates first and second matrices of near field and intermediate field values, respectively, from the samples obtained by the near field and intermediate field measurement devices, respectively, and inputs them to processing logic of the test system. The processing logic processes the first and second matrices of near field and intermediate field values, respectively, and derives a third matrix of near field phase values therefrom.

20 Claims, 5 Drawing Sheets

(56) References Cited

U.S. PATENT DOCUMENTS

| | | | |
|---|---|---|---|
| 9,588,173 B2* | 3/2017 | Isaac | G01R 31/2889 |
| 2012/0086612 A1 | 4/2012 | Linehan et al. | |
| 2014/0300519 A1 | 10/2014 | Estebe et al. | |
| 2015/0168486 A1* | 6/2015 | Isaac | G01R 31/2889 |
| | | | 324/756.02 |
| 2017/0033062 A1* | 2/2017 | Liu | H01L 23/66 |

OTHER PUBLICATIONS

Bucci et al., "Far-field pattern determination from the near-field amplitude on two surfaces," IEEE Transactions on Antennas and Propagation, vol. 38, No. 11, pp. 1772-1779 (1990).

Gerchberg et al., "A practical algorithm for the determination of phase from image and diffraction plane pictures," Optik, vol. 35, No. 2, pp. 237-246 (1972).

English language machine translation of CN104764938, published Jul. 8, 2015.

* cited by examiner

SYSTEM AND METHOD FOR PERFORMING OVER-THE-AIR (OTA) TESTING OF A DEVICE UNDER TEST (DUT) HAVING AN INTEGRATED TRANSMITTER-ANTENNA ASSEMBLY USING NEAR FIELD AND INTERMEDIATE FIELD MEASUREMENTS

BACKGROUND

In the next generation of wireless infrastructure (e.g., base stations, backbone, etc.) and customer handsets is called $5^{th}$ generation mobile networks or $5^{th}$ generation wireless systems hereinafter referred to as "5G". 5G is very ambitious and involves millimeter-wave frequency usage, compact phased arrays, and an unprecedented amount of electronic integration. Not only will the transmitters and receivers be integrated into transceivers, but transceivers will be integrated with patch antennas or antenna arrays. The integrated transceiver and antenna or antenna array is referred to hereinafter as an "integrated transceiver-antenna assembly." In the 5G integrated transceiver-antenna assembly, there will be no traditional connector from the radio electronics to the antenna. For example, the transceiver-antenna assembly may be in the same integrated circuit (IC) package or may be in separate IC packages that are interfaced with one another via, for example, a ball grid array (BGA) interface. In either case, the entire radio, including its antenna or antenna array and its transceiver, will be a single indivisible unit. Therefore, there will be no antenna ports that are accessible from the outside of the unit for connection with an external test system.

Nevertheless, radio manufacturers will want their units tested for all of the usual characteristics, e.g., receiver sensitivity, both without and with interference present, total transmit power, error vector magnitude (EVM) of modulation formats, antenna radiation pattern, etc. All of these parameters must be measured and studied in great detail during the product design phase. In the manufacturing phase, the characterization can be winnowed down, but the speed of testing becomes paramount in order to keep cost down and to be competitive with rival vendors.

The non-separable nature of an integrated transceiver-antenna assembly renders traditional transceiver testing methods useless. Traditionally, one disconnects the antenna and performs all of the receiver and transmitter tests by connecting test equipment to the radio's connector. However, no such connector will be available in the 5G units. Furthermore, the non-separable nature of the 5G integrated transceiver-antenna assembly introduces completely new challenges in testing the antenna itself. Traditional far field test chambers are large and expensive, and therefore manufacturers are eager for compact antenna test solutions, such as near field test systems. However, in order to apply Fourier transform methods to convert near field data to far field radiation patterns, both amplitude and phase information is needed in the near field sampling. When the antenna can be disconnected, this is straightforward to achieve because one can simply use a two-port network analyzer with the antenna of the device under test (DUT) as Port 1 and a calibrated antenna or horn as Port 2. However, when the antenna of the DUT is inseparable from the transceiver of the DUT, phase information can be unreliable because the phase of the local oscillator (LO) of the DUT is likely to drift relative to the phase of the LO of the test equipment.

Also, the speed at which testing is performed is an important issue that is not adequately addressed by any of the known or proposed over-the-air (OTA) test solutions. Many companies have proposed deploying multiple horns fixed in the far field to try to speed up the measurement of radiation patterns. The problem with such proposals is that, because a far field pattern is a distribution over a sphere and not a plane, the DUT would still need to be gimbaled over azimuth and elevation degrees of freedom rather than over X and Y translation degrees of freedom. If N horns are used to acquire signals simultaneously, a speed-up factor of N can be achieved when scanning a plane or a cylinder, but one encounters frequent redundant azimuth-elevation coordinate access when scanning a sphere. Thus, the speed-up factor is less than N.

Furthermore, with the advent of 5-bit to 6-bit amplitude and phase control of every antenna element in the DUT's patch array, the variety of radiation patterns that a 5G system designer has in his arsenal is huge. Multiplying this by the number of carrier frequencies at which the designer typically wishes to test, and doubling that for both polarizations to be tested, the amount of test data that has to be acquired becomes enormous. In such cases, due to the enormity of the data to be acquired, an entire day may be required to test a single antenna array. Therefore, a large speed-up factor in the amount of time that is required for testing is needed.

Accordingly, a need exists for a test system and method for performing OTA testing of a DUT having an integrated transceiver-antenna assembly that are capable of performing testing in a relatively short amount of time, in a relatively small area and at relatively low cost.

SUMMARY

The present embodiments are directed to a test system, a test method and a computer program for performing OTA testing of a DUT having a DUT transmitter and a DUT antenna that are integrated together in a package that does not include a connection port for interfacing the test system with the DUT antenna. The DUT transmitter generates radio frequency (RF) signals comprising a bounded radiation surface that are transmitted over the air by the DUT antenna.

The test system comprises a near field measurement device, an intermediate field measurement device and a test instrument. The near field measurement device samples a first bounded radiation surface in at least first and second directions that are different from one another to obtain a first matrix of near field values. The near field measurement device is positioned in a near field of the DUT antenna. The intermediate field measurement device samples a second bounded radiation surface in at least the first and second directions to obtain a second matrix of intermediate field values. The intermediate field measurement device is positioned in the intermediate field of the DUT antenna. The test instrument processes the first and second matrices of near field and intermediate field values, respectively, to derive a third matrix of near field phase values.

The method comprises steps of:
with a near field measurement device positioned in a near field of the DUT antenna, sampling a first bounded radiation surface comprising the RF signals in at least first and second directions that are different from one another to obtain a first matrix of near field values;
with an intermediate field measurement device positioned in an intermediate field of the DUT antenna, sampling a second bounded radiation surface comprising the RF signals in at least the first and second directions to obtain a second matrix of intermediate field values; and with processing logic of a test instrument, processing the first and second matrices of near field and intermediate field values, respectively, to derive a third matrix of near field phase values.

The computer program comprises first, second and third code segments. The first code segment receives a first matrix of near field values from a receiver of the test system obtained from electrical signals generated by a near field measurement device positioned in a near field of the DUT antenna that samples a first bounded radiation surface comprising the RF signals in at least first and second directions that are different from one another. The second code segment receives a second matrix of intermediate field values from the receiver obtained from electrical signals generated by an intermediate field measurement device positioned in an intermediate field of the DUT antenna that samples a second bounded radiation surface comprising the RF signals in at least the first and second directions. The third code segment processes the first and second matrices of near field and intermediate field values, respectively, and derives a third matrix of near field phase values from the first and second matrices of near field and intermediate field values, respectively.

These and other features and advantages will become apparent from the following description, claims and drawings.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
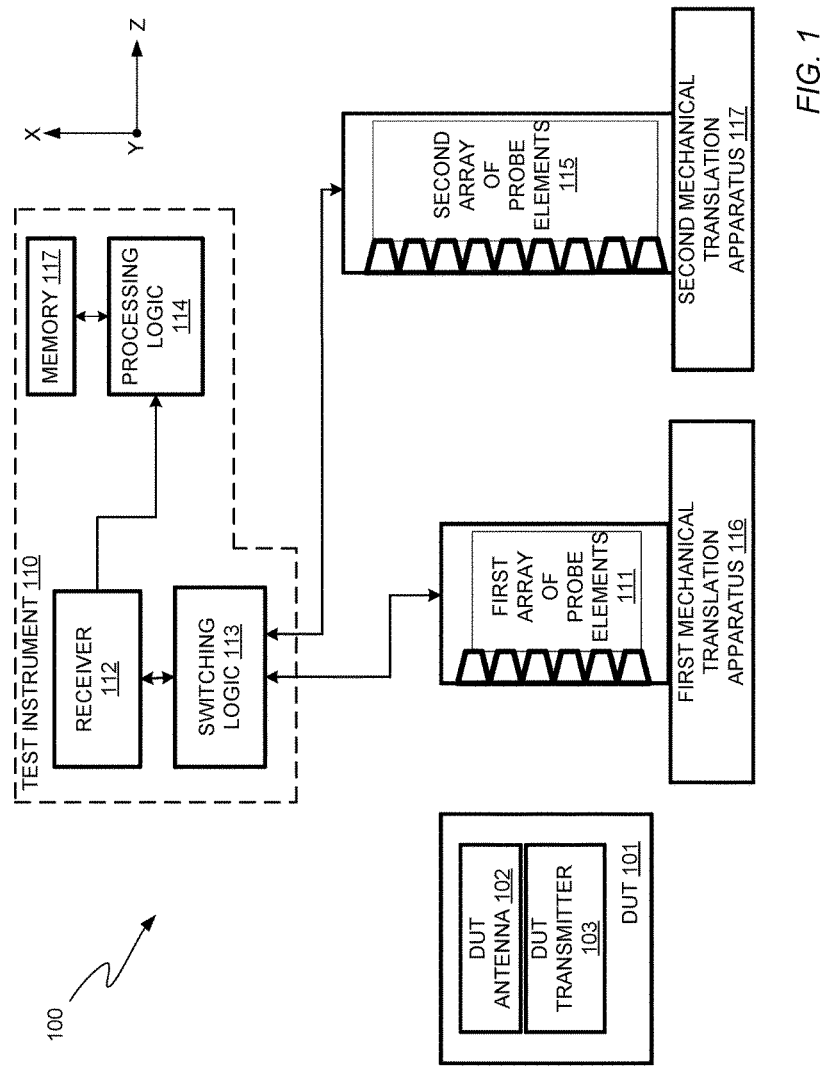
FIG. 1 illustrates a block diagram of the test system in accordance with a representative embodiment for testing a DUT.

In accordance with embodiments described herein, a test system and method are provided for testing a DUT having an antenna and a transmitter that are integrated together in a package that does not have an externally-accessible connection port for interconnecting the test system with the antenna. The test system is capable of performing OTA testing on the DUT in a relatively short amount of time, in a relatively small area and at relatively low cost.

Representative embodiments are described below with reference to FIGS. 1-4B. In the following detailed description, for purposes of explanation and not limitation, exemplary, or representative, embodiments disclosing specific details are set forth in order to provide a thorough understanding of an example of the manner in which the present invention can be embodied. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

As used in the specification and appended claims, the terms "a," "an," and "the" include both singular and plural referents, unless the context clearly dictates otherwise. Thus, for example, "a device" includes one device and plural devices. Relative terms may be used to describe the various elements' relationships to one another, as illustrated in the accompanying drawings. These relative terms are intended to encompass different orientations of the device and/or elements in addition to the orientation depicted in the drawings. It will be understood that when an element is referred to as being "connected to" or "coupled to" or "electrically coupled to" another element, it can be directly connected or coupled, or intervening elements may be present.

The term "memory" or "memory device", as those terms are used herein, are intended to denote a computer-readable storage medium that is capable of storing computer instructions, or computer code, for execution by one or more processors. The term "computer code," as that term is used herein, is intended to denote software and/or firmware designed for execution by a processor or processing core. References herein to "memory" or "memory device" should be interpreted as one or more memories or memory devices. The memory may, for example, be multiple memories within the same computer system. The memory may also be multiple memories distributed amongst multiple computer systems or computing devices.

A "processor," "processing core," or "processing logic," as those terms are used herein, encompass an electronic component that is able to execute a computer program or executable computer instructions. References herein to a computer comprising "a processor" should be interpreted as a computer having one or more processors or processing cores. The processor may for instance be a multi-core processor. A processor may also refer to a collection of processors within a single computer system or distributed amongst multiple computer systems. The term "computer" should also be interpreted as possibly referring to a collection or network of computers or computing devices, each comprising a processor or processors. Instructions of a computer program can be performed by multiple processors that may be within the same computer or that may be distributed across multiple computers.

As stated above, when the DUT antenna is inseparable from the DUT transceiver, the phase information collected by a single channel of test equipment can be rendered unreliable, or suspect, due to phase drift between the DUT LO and the test equipment LO. If the DUT LO coherence time is short, even switching from one probe element to the neighboring probe element within a given mechanically-accessed row of a two-dimensional (2-D) near field scan can result in the measured probe element-to-probe element relative phase value being unreliable due to LO phase drift. The following discussion provides various representative embodiments for obviating the phase drift problem while providing test systems that perform testing relatively quickly, in a relatively small spatial area and at relatively low cost.

In the following discussion, the following terms have the following meaning. The term "far field," as that term is used herein, denotes the field that is equal to or greater than the Fraunhofer distance, $D_f$, from the DUT antenna. The Fraunhofer distance is defined as $D_f=2D^2/\lambda$, where D is the diameter of the DUT antenna and $\lambda$ is the operating wavelength of the DUT antenna. The term "near field," as that term is used herein, denotes the field that extends a distance away from the DUT antenna that is on the order of $\lambda$ to D. The term "intermediate field," as that term is used herein, denotes the field that is in between the near field and the far field, as those terms have been defined herein. The term "near field values," as that term is used herein, denotes one or more of near field amplitude values, near field phase values and near field relative phase values. The term "near field phase values," as that term is used herein, denotes phase values that are contained in or are derived from corresponding near field values. In some embodiments, near field phase values are measured directly and in other embodiments they are derived from near field and intermediate field amplitude values.

FIG. 1 illustrates a block diagram of the test system 100 in accordance with a representative embodiment for testing a DUT 101 having a DUT antenna 102 and a DUT transmitter 103 that are integrated together and electrically interconnected inside of a package. The package has no externally-accessible antenna connection port for allowing the test system 100 to be electrically interconnected directly with the DUT antenna 102 or with the interconnection between the DUT antenna 102 and the DUT transmitter 103. The transmitter 103 is typically, but not necessarily, part of a transceiver that typically also includes a receiver. In the embodiments described herein, there is neither an RF connection nor an LO connection from the DUT 101 to the test system 100, although there may be, and typically are, direct current (DC), baseband and intermediate frequency (IF) connections between the DUT 101 and the test system 100. For ease of illustration and in the interest of brevity, the DC, baseband and IF connections are not shown in the figures or discussed herein.

The test system 100 comprises a test instrument 110, a first array of probe elements 111 located in the near field of the DUT antenna 102 and electrically coupled to the test instrument 110, a second array of probe elements 115 located in the intermediate field of the DUT antenna 102 and electrically coupled to the test instrument 110, a first mechanical translation apparatus 116 mechanically coupled to the first array of probe elements 111 and a second mechanical translation apparatus 117 mechanically coupled to the second array of probe elements 115. The first and second mechanical translation apparatuses 116 and 117 are parts of the same mechanical translation system, but are translated independently of one another.

The test instrument 110 of the test system 100 comprises a receiver 112, switching logic 113, processing logic 114, and a memory device 117. The receiver 112 is electrically coupled to the first and second arrays of probe elements 111 and 115, respectively, via the switching logic 113. The test system 100 performs OTA testing of the DUT 101.

During OTA testing of the DUT 101, the DUT antenna 102 transmits RF signals comprising a bounded radiation surface extending in at least first and second directions. The shape of the bounded radiation surface is not limited to being any particular shape and may be, for example, flat, curved, rectangular, oval, etc. The array of probe elements 111 is at least a 1-by-N array of probe elements, where N is a positive integer that is greater than or equal to 2. The N probe elements are positioned along a line that is parallel to the second direction. The spacing, or pitch, between adjacent probe elements of the array of probe elements 111 is typically about one-half of the operating wavelength of the DUT 101. For demonstrative purposes, the first and second directions are assumed to be the Y- and X-directions, respectively, of an X, Y, Z Cartesian coordinate system. Therefore, the first and second directions will be referred to herein interchangeably as the "Y-direction" and the "X-direction" or as the "first direction" and the "second direction," respectively. The first array of probe elements 111 is typically positioned a distance in the Z-dimension of about one operating wavelength of the DUT antenna 102 away from the DUT antenna 102 so that it is located in the near field of the DUT antenna 102.

The first array of probe elements 111 may be thought of as a wand that is movable, or translatable, in at least the Y-direction and will be referred to interchangeably herein as "the first wand 111" or as the "first array of probe elements 111." The first wand 111 comprises anechoic absorbing material in which the probe elements are encapsulated, but with openings in the anechoic absorbing material through which portions of the probe elements are exposed to allow them to sense the bounded radiation surface emitted by the DUT antenna 102.

During OTA testing, the first wand 111 is mechanically translated via the mechanical translation apparatus 116 in the Y-direction over M positions as it is rapidly electrically scanned in the X-direction, where M is a positive integer that is greater than or equal to 2. As the first wand 111 is translated in the Y-direction, it remains in the near field of the DUT antenna 102 and samples a first bounded radiation surface in the near field the X- and Y-directions. The receiver 112 controls the switching logic 113 to electrically scan the probe elements in the X-direction as the first wand 111 is mechanically translated in the Y-direction. The first wand 111 typically includes a field effect transistor (FET) switching tree (not shown for clarity) that is controlled via the switching logic 113 to cause the electrical signals generated by the probe elements to be sequentially sampled and transferred via the switching logic 113 from the first wand 111 to the receiver 112. It should be noted that other switching technologies, such as bipolar junction transistors (BJTs) or P-intrinsic-N(PIN) diodes, for example, may be used for this purpose. The inventive principles and concepts are not limited with respect to the types or configurations of switching devices that are used in the switching logic 113.

As a result of translating the first wand 111 in the Y-direction over M positions while electrically scanning the N probe elements of the first wand 111 in the X-direction, an M-by-N array of near field values are acquired by the receiver 112 and inputted to the processing logic 114.

After the near field values have been acquired, reference information is acquired by the second array of probe elements 115 and subsequently used in combination with the near field amplitude values to derive near field phase values, as will be described below in detail with reference to FIGS. 4A and 4B. The second array of probe elements 115 is positioned in the intermediate field of the DUT antenna 102. The second array of probe elements 115 is at least a 1-by-N' array of probe elements, where N' is a positive integer that is typically greater than N. The N' probe elements are positioned along an imaginary line that is parallel to the second direction. The spacing, or pitch, between adjacent probe elements of the second array of probe elements 115 is typically about one-half of the operating wavelength of the DUT 101 or slightly larger.

The second array of probe elements 115 may be thought of as a wand that is movable in at least the Y-direction and will be referred to interchangeably herein as "the second wand 115" or as the "second array of probe elements 115." Like the first wand 111, the second wand 115 comprises anechoic absorbing material in which the probe elements are encapsulated, but with openings in the anechoic absorbing material through which portions of the probe elements are exposed to allow them to sense the bounded radiation surface emitted by the DUT antenna 102.

In order to acquire the reference information, the first mechanical translation apparatus 116 translates the first wand 111 to a position so that it is not interposed between the DUT antenna 102 and the second wand 115. The second wand 115 is then mechanically translated via the mechanical translation apparatus 117 in the Y-direction over L positions as it is rapidly electrically scanned in the X-direction, where L is a positive integer that is greater than or equal to 2. As the second wand 115 is translated in the Y-direction, it remains in the intermediate field of the DUT antenna 102 and samples a second bounded radiation surface in the intermediate field of the DUT antenna 102 in the X- and Y-directions. The second bounded radiation surface corresponds to an expansion of the first bounded radiation surface in at least the X- and Y-directions. The receiver 112 controls the switching logic 113 to rapidly electrically scan the probe elements of the second wand 115 in the X-direction as the second wand 115 is mechanically translated in the Y-direction. Like the first wand 111, the second wand 115 typically includes a transistor switching tree (not shown for clarity) that is controlled via the switching logic 113 to cause the electrical signals generated by the probe elements of the second wand 115 to be sequentially sampled and transferred via the switching logic 113 from the second wand 115 to the receiver 112.

As a result of translating the second wand 115 in the Y-direction over L positions while electrically scanning the array of N' probe elements of the second wand 115 in the X-direction, an L-by-N' array of intermediate field values are acquired by the receiver 112 and inputted to the processing logic 114. The intermediate field values include at least intermediate field amplitude values. In accordance with a representative embodiment, the intermediate field values consist only of intermediate field amplitude values.

After the L-by-N' array of intermediate field values have been acquired and inputted to the processing logic 114, the processing logic 114 performs a derivation algorithm that uses the intermediate field amplitude values and the near field amplitude values to derive near field phase values. The derived near field phase values are not affected by phase drift between the LO of the DUT 101 and the LO of the test instrument 110. The manner in which the derivation algorithm uses the near field and intermediate field amplitude values to derive the near field phase values is described below in more detail with reference to FIGS. 4A and 4B.

The test system 100 is very compact and very fast compared to existing or proposed test systems for testing DUTs having an integrated antenna and transmitter and no connection port for interconnecting the test system with the DUT antenna. The primary reason for this is that the one-dimensional (1-D) mechanical translation performed by the mechanical translation apparatuses 116 and 117 is orders of magnitude faster than 2-D mechanical translation performed by existing and/or proposed test systems, such as those that perform 2-D gimballing, for example. Another reason for the compactness of the test system 100 is due to locating the second wand 115 in the intermediate field instead of in the far field of the DUT antenna 102. In addition, positioning the second wand 115 in the intermediate field rather than in the far field of the DUT antenna 102 allows the second wand 115 to be slightly smaller in the X-dimension than it would have to be if it were positioned in the far field of the DUT antenna 102. Although the second wand 115 needs to be larger in the X-dimension than the first wand 111 due to the expansion of the bounded radiation surface emitted by DUT antenna 102, the second wand 115 typically needs only be about 20% longer than the first wand 111. For a spacing between the probe elements of the second wand 115 of typically one-half wavelength, this results in the number of probe elements of the second wand 115, N', being about 1.2N, where N is the number of probe elements of the first wand 111 having the same pitch between adjacent probe elements. It should be noted, however, that the inventive principles and concepts are not limited in regard to the physical sizes of the first and second wands 111 and 115, respectively, the pitch between adjacent probe elements of the first and second wands 111 and 115, respectively, of the numbers of probe elements N and N' of the first and second wands 111 and 115, respectively.

It should be noted that while FIG. 1 depicts the use of the first and second wands 111 and 115 are near field and intermediate field measurement devices, respectively, the inventive principles and concepts are not limited to using first and second wands as the near field and intermediate field measurement devices, respectively. As will be understood by those of skill in the art in view of the description provided herein, other types of near field and intermediate field measurement devices may be used for this purpose. Also, although FIG. 1 depicts first and second mechanical translation apparatuses for translating the first and second wands 111 and 115, respectively, in the Y-direction, the near field and intermediate field measurement devices may be configured with an all-electrical-scanning configuration to electrically scan the probe elements in the X- and Y-directions such that no mechanical translation of the near field and intermediate field measurement devices is needed.

Figure 2:
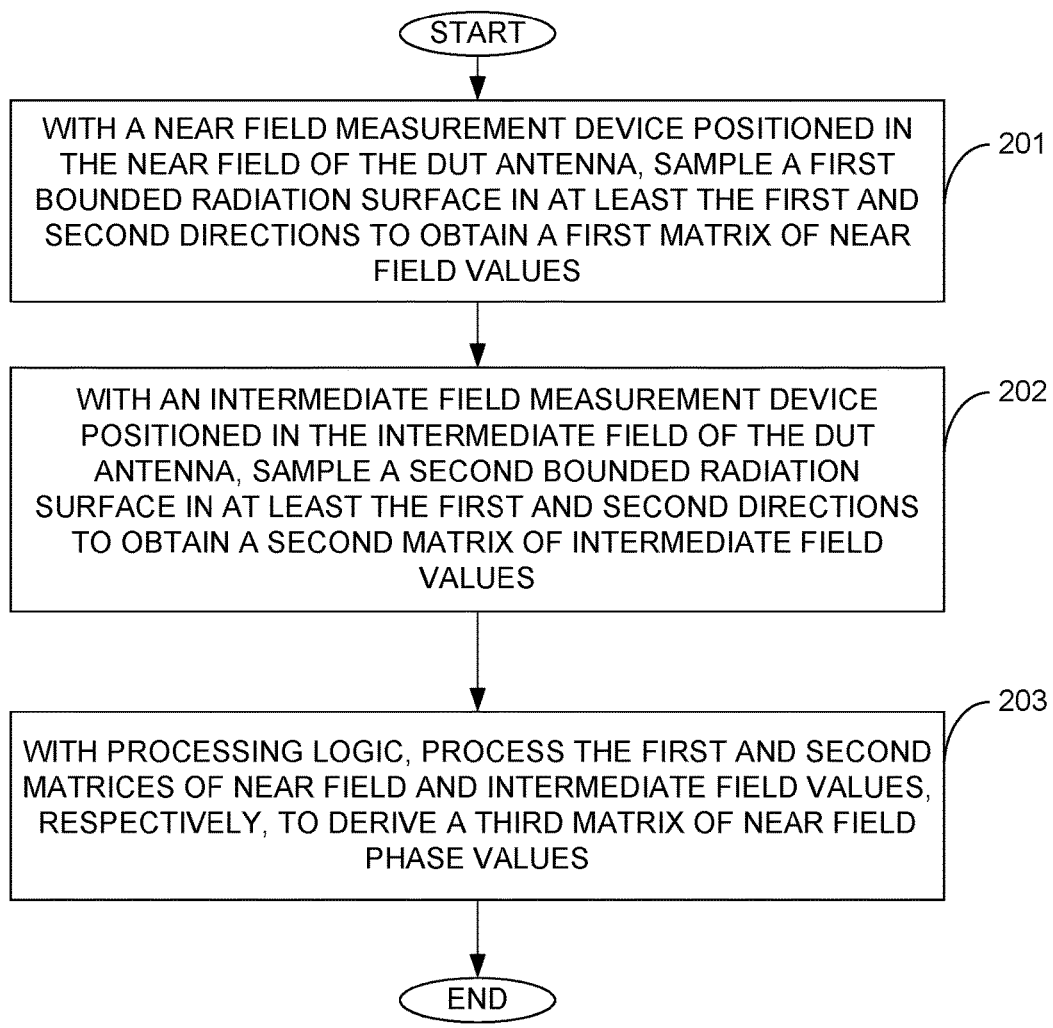
FIG. 2 illustrates a flow diagram representing the test method in accordance with a representative embodiment.

FIG. 2 illustrates a flow diagram of the OTA test method in accordance with a representative embodiment. With a near field measurement device positioned in a near field of the DUT antenna, a first bounded radiation surface comprising the RF signals is sampled in at least first and second directions that are different from one another to obtain a first matrix of near field values, as indicated by block 201. With an intermediate field measurement device positioned in an intermediate field of the DUT antenna, a second bounded radiation surface comprising the RF signals is sampled in at least the first and second directions to obtain a second matrix of intermediate field values, as indicated by block 202. With processing logic, the first and second matrices of near field and intermediate field values, respectively, are processed to derive a third matrix of near field phase values, as indicated by block 203.

Figure 3:
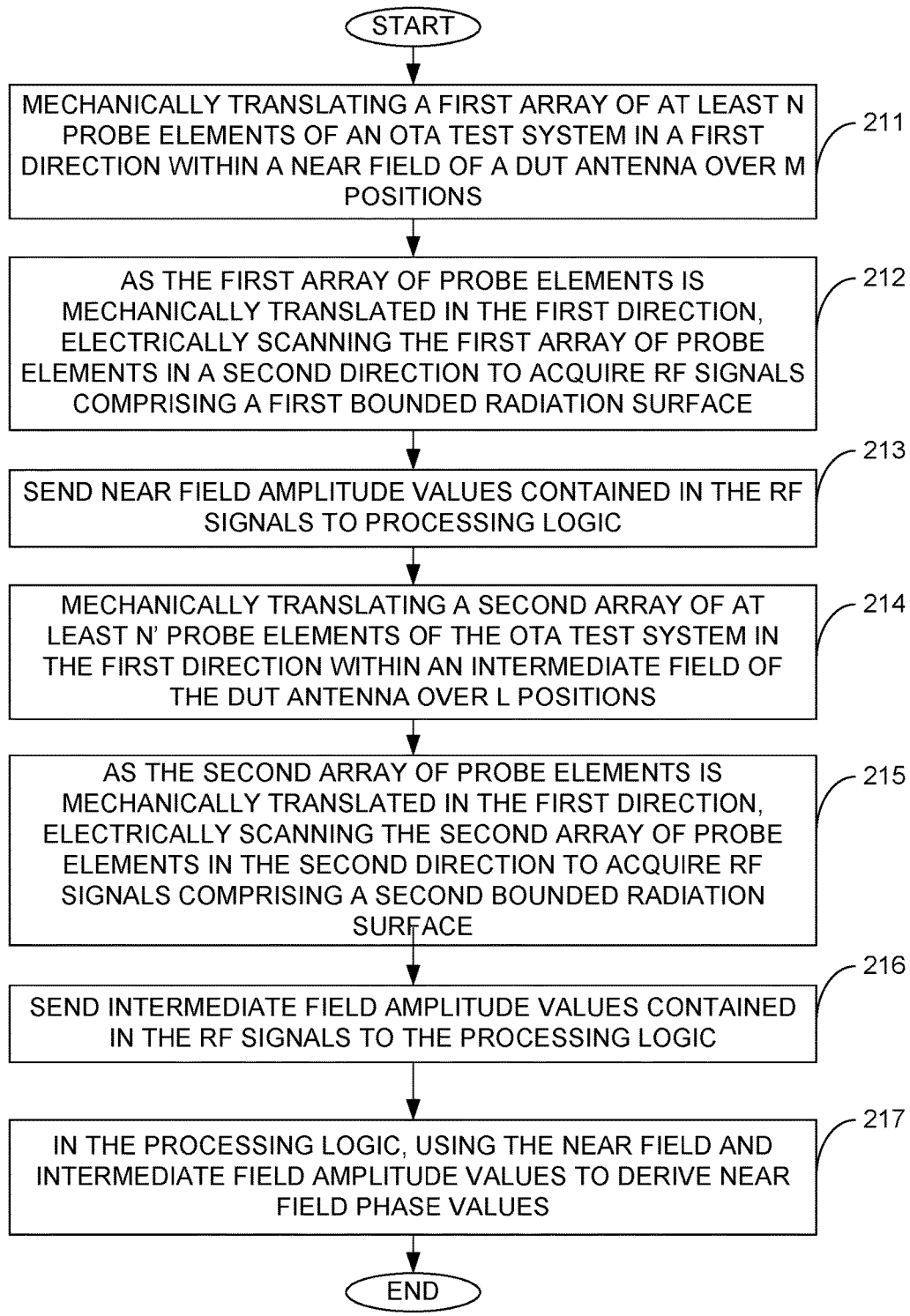
FIG. 3 illustrates a flow diagram representing the test method in accordance with a representative embodiment.

As indicated above, the near field and near field measurement devices can take on a variety of configurations, and therefore the method performed by the test system can also be varied in a number of ways. FIG. 3 illustrates a flow diagram of the OTA test method in accordance with a representative embodiment performed by a test system having the configuration shown in FIG. 1. A first array of at least N probe elements of an OTA test system is mechanically translated in a first direction within a near field of the DUT over M positions, as indicated by block 211. As the first array of probe elements is mechanically translated in the first direction, the array is electronically scanned in a second direction that is different from the first direction to acquire RF signals comprising a bounded radiation surface, as indicated by block 212. Near field amplitude values contained in the RF signals are sent to processing logic, as indicated by block 213.

A second array of at least N' probe elements of the OTA test system is mechanically translated in the first direction within an intermediate field of the DUT over L positions, as indicated by block 214. As the second array of probe elements is mechanically translated in the first direction, the second array is electronically scanned in the second direction to acquire RF signals comprising a bounded radiation surface, as indicated by block 215. Intermediate field amplitude values contained in the RF signals are sent to the processing logic, as indicated by block 216. The processing logic then uses the near field and intermediate field amplitude values to derive near field phase values, as indicated by block 217.

The derivation algorithm is typically implemented in software and/or firmware that is executed by the processing logic 114, which may be, for example, a single or multi-core microprocessor, a microcontroller, an application specific integrated circuit (ASIC), a digital signal processor (DSP), etc. The computer code comprising the software and/or firmware is typically stored in the memory device 117. While the memory device 117 is shown as being external to the processing logic 114, it may be instead be internal to the processing logic 114. For illustrative purposes, the memory device 117 is shown in FIG. 1 as being external to the processing logic 114. The memory device 117 may be any suitable non-transitory computer-readable medium, including, for example, read only memory (ROM), random access memory (RAM), flash memory, programmable read only memory (PROM), erasable programmable read only memory (EPROM), optical memory devices, magnetic memory devices, etc.

Some of the inventive principles and concepts disclosed herein are based, in part, on the theory of fractional Fourier transforms, which indicates that a radiation amplitude profile takes on substantial far field characteristics at about $D^2/3\lambda$, i.e., about one-third of the Fraunhofer distance, $D_f$. A fractional Fourier transform is a power $F^a$ of the usual Fourier transform, F, where the fractional parameter, a, can take on any real value. The application of this theory to the principles and concepts described herein indicates that the second wand 115 can be located in the intermediate field rather than in the far field, leading to the aforementioned advantages, i.e., compactness of the test system 100, a smaller size for the second wand 115, and a need for fewer probe elements in the second wand 115. Another advantage of this is that it allows the test system 115 to be placed in a relatively small anechoic chamber that is significant less costly than a large anechoic chamber of the type often used in test systems that measure far field values.

Figure 4A:
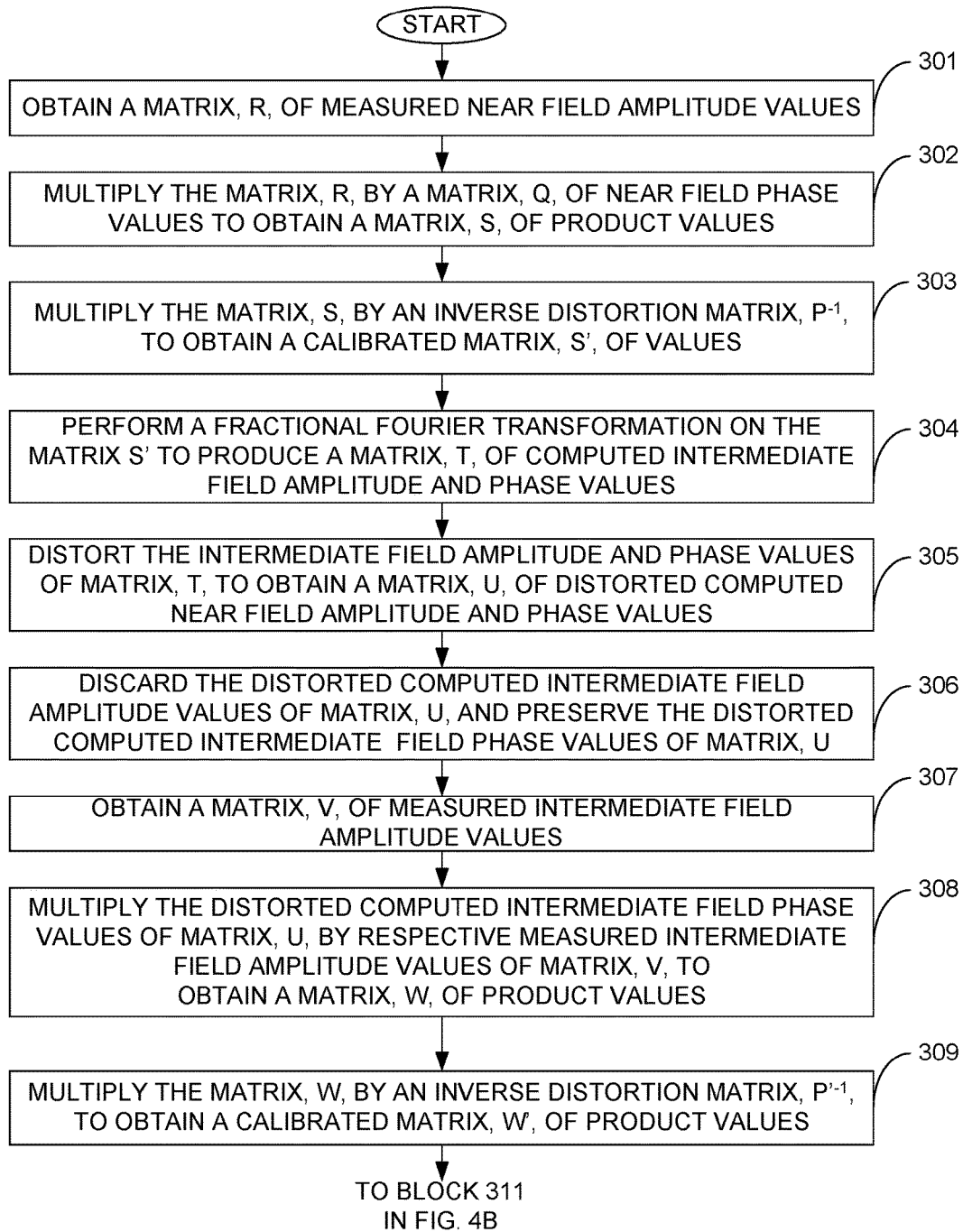
FIGS. 4A and 4B illustrate a flow diagram representing the test method in accordance with another representative embodiment.
Figure 4B:
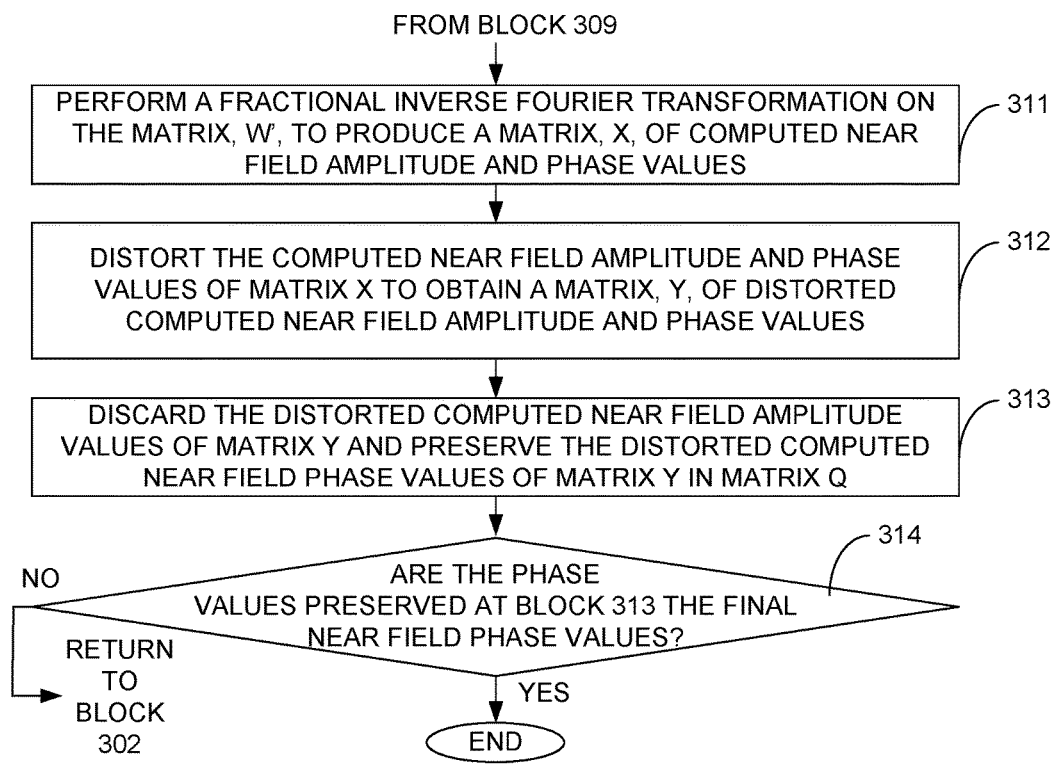

FIGS. 4A and 4B illustrate a flow diagram of the derivation algorithm that uses the measured near field and intermediate field amplitude values to derive, or compute, the near field phase values. The derivation algorithm is a modified version of a known algorithm referred to herein as the Gerchberg-Saxton alternating projection algorithm, which was disclosed in an article entitled "A Practical Algorithm For The Determination Of Phase From Image And Diffraction Plane Pictures," by R. W. Gerchberg and W. O. Saxton, Optik, Volume 35, No. 2, pages 237-246 (1972), which is incorporated by reference herein.

In the original Gerchberg-Saxton alternating projection algorithm, the second bounded radiation surface was sampled in the far field, and therefore the full Fourier transform (i.e., the fractional parameter, a, equal to 1) was used in the algorithm. In accordance with the representative embodiment, the second bounded radiation surface, i.e., the bounded radiation surface being sampled by the second wand 115, is in the intermediate field. Therefore, the fractional Fourier parameter, a, is less than 1 and greater than or equal to 0. Using a value for the fractional parameter, a, that is greater than 0 and less than or equal to 1 is one of the modifications to the original Gerchberg-Saxton alternating projection algorithm incorporated into the derivation algorithm described herein. The bounded radiation surfaces sampled by the first and second wands 111 and 115, respectively, will be referred to hereinafter as the first and second bounded radiation surfaces, respectively.

Another modification to the original Gerchberg-Saxton alternating projection algorithm incorporated into the derivation algorithm described herein is a calibration process that allows imperfect measurements in the form of distortions, or coherent convolutions, to be used. Realistic probe elements sample the electromagnetic fields with some proximity effect, or coherent blur. In accordance with a representative embodiment, first and second sampling distortion matrices are obtained prior to or during the derivation algorithm by calibrating the probe elements of the first and second wands 111 and 115, respectively, to ascertain sampling distortion matrices P and P' at the first and second bounded radiation surfaces, respectively. The inverse distortion matrices $P^{-1}$ and $P'^{-1}$ are then obtained on a one-time basis. As part of the derivation algorithm, these matrices are multiplied by matrices containing products of the amplitude and phase, or more precisely, the amplitude and the exponentiated phase, to calibrate them values by performing anti-distortion, as will be described below in more detail with reference to FIGS. 4A and 4B.

The Gerchberg-Saxton alternating projection algorithm uses a function that is a product of an array of phase values and an array of amplitude values. In the original Gerchberg-Saxton alternating projection algorithm, the initial matrix of near field phase values that was used to calculate that function were obtained by using a random number generator to randomly generate phase values between $\pi$ and $-\pi$ In accordance with a representative embodiment, the matrix of initial near field phase values, Q, that is used in the derivation algorithm comprises randomly-generated near field phase values generated by a random number generator. Alternatively, the matrix of initial near field phase values, Q, that is used is obtained from the DUT manufacturer's phased array simulations. As yet another alternative, the matrix of initial near field phase values, Q, comprises measured phase values obtained from the RF signals measured by the probe elements of the first wand 111.

With reference to FIG. 4A, the process described above with reference to blocks 211-213 of FIG. 3 is performed to obtain a matrix, R, of measured near field amplitude values, as indicated by block 301. The measured near field amplitude values of the matrix, R, are then multiplied by the initial phase values, or more precisely, their exponentiation, of the matrix, Q, to obtain a matrix, S, of product values, as indicated by block 302. The multiplication process performed in the step represented by block 302 is an element-by-element multiplication process. For example, the initial phase value at column 1, row 1 of matrix, Q, is multiplied by the measured near field amplitude value at row 1, column 1 of the matrix, R, and the product becomes a value at row 1, column 1 of the matrix, S. This element-by-element multiplication process is performed for each, row, column position of the matrices Q and R.

The matrix, S, is then multiplied by the inverse distortion matrix $P^{-1}$ using normal matrix multiplication (i.e., noncommutative) to obtain a calibrated matrix, S', of values, as indicated by block 303. A fractional Fourier transformation, $F^a$, operation is then performed on the matrix S', with the fractional parameter, a, set to a value that is greater than 0 and less than 1 to compute a matrix, T, of computed intermediate field amplitude and phase values, as indicated by block 304. The fractional Fourier transform, Fa, is an example of a near field-to-intermediate field propagator that is suitable for this purpose, although other near field-to-intermediate field propagators can be used for this purpose, such as an angular spectrum calculation, for example. The computed intermediate field amplitude and phase values of the matrix, T, are then distorted by performing an operation that is essentially the reverse of the operation performed at the step represented by block 303. The distortion operation produces a matrix, U, of distorted computed intermediate field amplitude and phase values, as indicated by block 305. The distorted computed intermediate field amplitude values of the matrix, U, are then discarded while the distorted computed intermediate field phase values of the matrix, U, are preserved, e.g., stored in the memory device 117 (FIG. 1), as indicated by block 306.

The process represented by blocks 214-216 described above with reference to FIG. 3 is then performed to obtain a matrix, V, of measured intermediate field amplitude values, as indicated by block 307. The measured intermediate field amplitude values of the matrix, V, are then multiplied by the respective distorted computed intermediate field phase values of the matrix, U, to obtain a matrix, W, of product values, as indicated by block 308. As with the process represented by block 302, the multiplication process performed in the step represented by block 308 is an element-by-element multiplication process. The matrix, W, of product values is then multiplied by the inverse distortion matrix $P'^{-1}$ to obtain a calibrated matrix, W', of product values, as indicated by block 309. The process then proceeds to block 311 in FIG. 4B.

At block 311, an inverse fractional Fourier transformation operation is performed on the matrix, W', with the fractional parameter, a, set to a value that is greater than 0 and less than 1 to compute a matrix, X, of computed near field amplitude and phase values, as indicated by block 311. In the step represented by block 312, the computed near field amplitude and phase values of the matrix, X, are distorted by performing an operation that is essentially the reverse of the operation performed at the step represented by block 303. The distortion operation produces a matrix, Y, of distorted computed near field amplitude and phase values. The distorted computed near field amplitude values of the matrix, Y, are then discarded while the distorted computed near field phase values of the matrix, Y, are preserved as matrix Q, e.g., stored in the memory device 117 (FIG. 1), as indicated by block 313

A determination is then made at block 314 as to whether the matrix, Q, of distorted computed phase values preserved at the step represented by block 313 is the final matrix of distorted computed near field phase values. The process represented by blocks 301-314 is an iterative process that is either performed a predetermined number of times (e.g., 10 to 30 times) deemed sufficient to reach a final matrix of the near field phase values or until some convergence criterion is met. In the latter case, the convergence criterion may be, for example, whether or not the squared error is equal to 0 or sufficiently close to 0. The squared error may be defined as the sum of the squared differences between successive iterations of weighted phases of points on either the first or second bounded radiation surface such that when the squared error is equal to 0, the correct phase values of the points on both the first and second bounded radiation surfaces have been found. An appropriate weighting scheme will weight the points of higher measured amplitude more heavily. Block 314 in FIG. 4B represents either a determination as to whether a predetermined number of iterations of the derivation process have been performed or a determination as to whether such a convergence criterion has been met.

If a determination is made at block 314 that the matrix, Q, of distorted computed near field phase values preserved at block 313 is not the final matrix of near field phase values, the process returns to block 302 and the process represented by blocks 302-314 reiterates. If the process returns to block 302, the near field phase values of the current matrix Q preserved at block 313 of FIG. 4B instead of the initial phase values are multiplied by the near field amplitude values of matrix R. The process then continues through blocks 303 through 314 as described above except that at block 307 the existing matrix V is kept rather than obtaining a new matrix V of intermediate field amplitude values. If a determination is made at block 314 that the matrix, Q, of distorted computed near field phase values is the final matrix of near field phase values, the process ends.

While the inventive principles and concepts have been illustrated and described in detail in the drawings and foregoing description, such illustration and description are to be considered illustrative or exemplary and not restrictive; the invention is not limited to the disclosed embodiments. For example, the test system 100 shown in FIG. 1 is one of many possible configurations that may be used to perform the inventive methods, as will be understood by persons of skill in the art in view of the description provided herein. Also, although the second wand 115 is shown as being linearly-shaped, or straight, in the X-direction, it could instead be concave relative to the DUT antenna 102 so that the probe elements of the second wand 115 sense a cylindrically-shaped second bounded radiation surface. As another example, although the second mechanical translation apparatus 117 has been described as being moved linearly in the Y-direction, it could instead be translated through an arc in the first (Y) direction and in a third (Z) direction such that the probe elements sense an ellipsoidal or spherical second bounded radiation surface. This could be advantageous in cases in which the DUT antenna 102 has low gain or the second wand 115 is offset in position a relatively large distance from boresight. As yet another example, one or both of the wands 111 and 115 could be two-dimensional arrays instead of linear arrays of probe elements. It is also possible to use a single wand 111 or 115 and to mechanically translate it over all of the required positions. Many modifications may also be made to the methods described above with reference to FIGS. 2-4B. For example, the sequence or order in which some of the steps represented by the blocks shown in FIG. 3 are performed can be changed. Likewise, the sequence or order in which some of the steps represented by the blocks shown in FIGS. 4A and 4B are performed can be changed. These and other modifications may be made, as will be understood by those skilled in the art in view of the present disclosure, without deviating from the inventive principles and concepts.

What is claimed is:

1. A test system for performing over-the-air (OTA) testing of a device under test (DUT) having a DUT transmitter and a DUT antenna that are integrated together in a package that does not include a connection port for interfacing the test system with the DUT antenna, the DUT transmitter generating radio frequency (RF) signals comprising a bounded radiation surface that are transmitted over the air by the DUT antenna, the test system comprising:
- a near field measurement device that samples a first bounded radiation surface comprising the RF signals in at least first and second directions that are different from one another to obtain a first matrix of near field values, the near field measurement device being positioned in a near field of the DUT antenna;
- an intermediate field measurement device that samples a second bounded radiation surface comprising the RF signals in at least the first and second directions to obtain a second matrix of intermediate field values, the intermediate field measurement device being positioned in an intermediate field of the DUT antenna; and
- a test instrument that processes the first and second matrices of near field and intermediate field values, respectively, to derive a third matrix of near field phase values.

2. The test system of claim 1, wherein the near field and intermediate field measurement devices are first and second wands of at least N and N' probe elements, respectively, where N and N' are positive integers that are greater than or equal to 2, each of the probe elements of the first wand detecting the RF signals and generating respective electrical signals comprising the near field values, each of the probe elements of the second wand detecting the RF signals and generating respective electrical signals comprising the intermediate field values, the test system further comprising:
- a mechanical translation system including first and second mechanical translation apparatuses for translating the first and second wands in at least the first direction within the near field and intermediate fields, respectively, of the DUT antenna, and wherein the test instrument comprises a receiver, switching logic, and processing logic, the first mechanical translation apparatus mechanically translating the first wand in at least the first direction over M positions within the near field of the DUT antenna while the receiver causes the switching logic to electrically scan the probe elements of the first wand in a second direction that is different from the first direction to acquire the first matrix of near field values, where M is a positive integer that is greater than or equal to 2, the second mechanical translation apparatus mechanically translating the second wand in at least the first direction over L positions within the intermediate field of the DUT antenna while the receiver causes the switching logic to electrically scan the probe elements of the second wand in the second direction to acquire the second matrix of intermediate field values, where L is a positive integer that is greater than or equal to 2, the processing logic being configured to process the first and second matrices of near field and intermediate field values, respectively, to derive the third matrix of near field phase values.

3. The test system of claim 2, wherein the first and second matrices of near field and intermediate field values, respectively, comprise near field and intermediate field amplitude values, respectively, and wherein the third matrix of near field phase values is derived by the processing logic from the first and second matrices of near field and intermediate field amplitude values, respectively.

4. The test system of claim 2, wherein the first and second directions are orthogonal to one another.

5. The test system of claim 2, wherein N' is greater that or equal to 1.2N.

6. The test system of claim 2, wherein the second wand is mechanically translated in the first direction by at least twenty percent more than the first wand is mechanically translated in the first direction.

7. The test system of claim 2, wherein the second mechanical translation apparatus mechanically translates the second wand in an arc in the first direction and in a third direction.

8. The test system of claim 2, wherein the first, second and third directions are orthogonal to one another.

9. The test system of claim 2, wherein the second wand is concave in shape relative to the DUT antenna.

10. The test system of claim 2, wherein the second wand remains a distance (d) from the DUT antenna of at least $2D^2/3\lambda$, where D is a diameter of the DUT antenna and $\lambda$ is an operating wavelength of the DUT antenna.

11. A method for performing over-the-air (OTA) testing of a device under test (DUT) having a DUT antenna and a DUT transmitter that are integrated together in a package that does not include a connection port for interfacing a test system with the DUT antenna, the DUT transmitter generating radio frequency (RF) signals comprising a bounded radiation surface that are transmitted over the air by the DUT antenna, the method comprising:
- with a near field measurement device, sampling a first bounded radiation surface comprising the RF signals in at least first and second directions that are different from one another to obtain a first matrix of near field values, the near field measurement device being positioned in a near field of the DUT antenna;
- with an intermediate field measurement device, sampling a second bounded radiation surface comprising the RF signals in at least the first and second directions to obtain a second matrix of intermediate field values, the intermediate field measurement device being positioned in an intermediate field of the DUT antenna; and
- with processing logic of a test instrument, processing the first and second matrices of near field and intermediate field values, respectively, to derive a third matrix of near field phase values.

12. The method of claim 11, wherein the near field and intermediate field measurement devices comprise first and second wands having at least N and N' probe elements, respectively, where N and N' are positive integers that are greater than 2, and wherein the test instruments comprises first and second mechanical translation apparatuses, a receiver, switching logic and processing logic, the step of sampling the first bounded radiation surface includes causing the first mechanical translation apparatus to mechanically translate the first wand in at least the first direction over M positions within the near field of the DUT antenna, where M is a positive integer that is greater than or equal to 2, as the receiver controls the switching logic to electrically scan the probe elements of the first wand in the second direction to acquire the RF signals comprising the first bounded radiation surface, and wherein the step of sampling the second bounded radiation surface includes causing the second mechanical translation apparatus to mechanically translate the second wand in at least the first direction over L positions within the intermediate field of the DUT antenna, where L is a positive integer that is greater than or equal to 2, as the receiver controls the switching logic to electrically scan the probe elements of the second wand in the second direction to acquire the RF signals comprising the second bounded radiation surface, and wherein the step of processing the first and second matrices of near field and intermediate field values, respectively, includes generating the first and second matrices of near field and intermediate field values, respectively, in the receiver from the RF signals comprising the first and second bounded radiation surfaces, sending the first and second matrices from the receiver to the processing logic, and using the first and second matrices of near field and intermediate field values to derive a third matrix of near field phase values.

13. The method of claim 12, wherein the first and second matrices of near field and intermediate field values, respectively, comprise near field and intermediate field amplitude values, respectively, and wherein the third matrix of near field phase values is derived by the processing logic from the first and second matrices of near field and intermediate field amplitude values, respectively.

14. The method of claim 12, wherein the first and second directions are orthogonal to one another.

15. The method of claim 12, wherein N' is greater that or equal to 1.2N.

16. The method of claim 12, wherein the second wand is mechanically translated in the first direction by at least twenty percent more than the first wand is mechanically translated in the first direction.

17. The method of claim 12, wherein the second mechanical translation apparatus mechanically translates the second wand in an arc in the first direction and in a third direction that is different from the first and second directions.

18. The method of claim 17, wherein the first, second and third directions are orthogonal to one another.

19. The method of claim 12, wherein the second wand remains a distance (d) from the DUT antenna of at least $2D^2/3\lambda$, where D is a diameter of the DUT antenna and $\lambda$ is an operating wavelength of the DUT antenna.

20. A computer program embodied on a non-transitory computer-readable medium, the computer program comprising instructions for execution by a processor for deriving near field phase values when performing over-the-air (OTA) testing of a device under test (DUT) having a DUT transmitter and a DUT antenna that are integrated together in a package, the DUT transmitter generating radio frequency (RF) signals that are transmitted over air by the DUT antenna, the computer program comprising:

a first code segment that receives a first matrix of near field values from a receiver of a test system, the first matrix of near field values being obtained from electrical signals generated by a near field measurement device positioned in a near field of the DUT antenna that samples a first bounded radiation surface comprising the RF signals in at least first and second directions that are different from one another;

a second code segment that receives a second matrix of intermediate field values from the receiver, the second matrix of intermediate field values being obtained from electrical signals generated by an intermediate field measurement device, positioned in an intermediate field of the DUT antenna, that samples a second bounded radiation surface comprising the RF signals in at least the first and second directions; and a third code segment that processes the first and second matrices of near field and intermediate field values, respectively, and derives a third matrix of near field phase values from the first and second matrices of near field and intermediate field values, respectively.

* * * * *